United States Patent [19]

Tejwani et al.

[11] Patent Number: 5,310,451
[45] Date of Patent: May 10, 1994

[54] METHOD OF FORMING AN ULTRA-UNIFORM SILICON-ON-INSULATOR LAYER

[75] Inventors: Manu J. Tejwani; Subramanian S. Iyer, both of Yorktown Heights, N.Y.

[73] Assignee: International Business Machines Corporation, Armonk, N.Y.

[21] Appl. No.: 108,272

[22] Filed: Aug. 19, 1993

[51] Int. Cl.$^5$ .......................... H01L 21/306
[52] U.S. Cl. .................... 156/630; 437/62; 437/974; 148/DIG. 12; 156/662
[58] Field of Search ............ 437/62, 974, 228; 148/DIG. 12; 156/630, 662

[56] References Cited

U.S. PATENT DOCUMENTS

| | | | |
|---|---|---|---|
| 4,601,779 | 7/1986 | Abernathey et al. | 156/628 |
| 4,735,679 | 4/1988 | Lasky | 156/636 |
| 4,962,051 | 10/1990 | Liaw | 437/62 |
| 4,983,251 | 1/1991 | Haisma et al. | 148/DIG. 12 |
| 5,013,681 | 5/1991 | Godbey et al. | 437/86 |
| 5,034,343 | 7/1991 | Rouse et al. | 437/974 |
| 5,234,535 | 8/1993 | Beyer et al. | 156/630 |

FOREIGN PATENT DOCUMENTS 0046315 2/1991 Japan .................. 148/DIG. 12

OTHER PUBLICATIONS

P. E. Cade et al., "Methods of Producing Single-Crystal Silicon on Silicon Dioxide", IBM Technical Disclosure Bulletin, vol. 28, No. 5, Oct. 1985, pp. 1855–1856.

*Primary Examiner*—Brian E. Hearn
*Assistant Examiner*—Trung Dang
*Attorney, Agent, or Firm*—Michael J. Balconi-Lamica

[57] ABSTRACT

A method of forming a thin semiconductor layer having ultra-high thickness uniformity and upon which semiconductor structures can subsequently be formed is disclosed. The method comprises providing a primary substrate having a prescribed total thickness variation (TTV). A stack is formed upon the primary substrate for compressing thickness variation to be transferred into the thin semiconductor layer. An epitaxial silicon layer of a desired SOI thickness is formed upon the stack. The epitaxial silicon layer is then bonded to a mechanical substrate to form a bonded substrate pair, the mechanical substrate having a prescribed TTV and the bonded substrate pair having a combined TTV equal to the sum of the TTVs of the primary and mechanical substrates, respectively. The primary substrate is subsequently removed, wherein the combined TTV of the bonded substrate pair is transferred and compressed into the stack by a first compression amount. The stack is thereafter removed, wherein the combined TTV of the bonded substrate pair is further transferred and compressed a second compression amount into said epitaxial silicon layer, whereby said epitaxial silicon layer remains on said mechanical substrate to form the semiconductor layer of ultra-high thickness uniformity, the thickness uniformity being a controlled function of the first and second compression amounts.

17 Claims, 3 Drawing Sheets

METHOD OF FORMING AN ULTRA-UNIFORM SILICON-ON-INSULATOR LAYER

BACKGROUND OF THE INVENTION

1. Field of the Invention

The present invention relates to a method of forming a silicon-on-insulator structure, and more particularly, an ultra-uniform bond and etch back silicon-on-insulator semiconductor layer.

2. Discussion of the Related Art

Silicon-on-insulator (SOI) technology provides a promising method for fabrication of very large scale integration (VLSI) integrated circuits, in which the dimensions of transistors and other semiconductor structures are below one micrometer. SOI technology addresses a host of problems associated with VLSI, for example, providing greater isolation between devices. For CMOS applications, this isolation must prevent latch-up and at the same time, must not be provided at the expense of available chip space. Furthermore, the threshold voltage of CMOS devices critically depends on the thickness and uniformity of the SOI layer. New high performance CMOS device and circuit designs are based upon SOI material which is not only exceedingly thin, i.e., 100–200 nm thick, but also exceedingly uniform, i.e., within a few nanometers, across a silicon wafer of 4–8" in diameter.

One method of forming an SOI substrate includes bond and etch back silicon-on-insulator (BESOI) technology. A BESOI substrate is formed by oxidizing a handle wafer and/or a seed wafer, followed by bonding the two wafers. The active device region is generated on the seed wafer by lapping and etching to the desired silicon film thickness. BESOI technology thus provides a clean oxide/silicon interface with a minimal amount of defects and charge trapping states in the buried oxide. While this technology is suitable for the fabrication of 600 nm SOI, the presence of an etch stop is required to achieve SOI wafers with a nominal thickness of 500 nm or less.

Another method for producing a thin SOI semiconductor layer from a wafer structure comprising a silicon layer, an oxide isolation layer, and a handle wafer, is to etch trenches through the silicon layer down to the underlying oxide isolation layer. Polish stop pads (or etch stop pads) of a desired thickness are then formed or deposited within the trenches. The thickness of the polish stop pads corresponds to the desired resultant SOI semiconductor layer thickness. The silicon layer is then polished down, the polishing being stopped at the polish stop pads. The remaining silicon positioned between polish stop pads forms the SOI semiconductor layer of desired thickness upon which semiconductor device may subsequently be formed. Disadvantages of this method include the need for optimizing the pattern factor associated with the locations of the polish stop pads in the silicon layer. The pattern factor is critical. For example, spacing of polish stop pads too far from one another can cause dish-out or non-uniformity effects in the polished silicon. Such dish-out or non-uniformity is highly undesirable. On the other hand, having too large a pattern factor, i.e., too many polish stop pads, reduces the amount of available SOI semiconductor layer. In the latter instance, thin uniform SOI is obtainable, but not over the entire area of the wafer.

Another example of an etch stop for achieving SOI wafers with a nominal thickness of 500 nm or less has been providing a heavily doped boron region placed by diffusion or implantation into the silicon. Most of the silicon substrate underlying the boron doped etch stop region is removed by grinding and polishing and a remainder portion thereof is selectively etched using an etchant consisting of ethylene diamine and pyrocatechol. With this etchant, nominal selectivity ratios of 1000:1 are reported for etch rates of undoped silicon compared to the etch rate of the very heavily doped boron etch stop region. A disadvantage of using a heavily doped boron region however is that boron is a p-type dopant in silicon. Additionally, both implantation and diffusion of boron results in residual p-type doping of the silicon film. Still further, boron incorporated by ion implantation and annealing results in the generation of threading dislocations in the device region. Performance of devices made from these SOI materials is undesirably compromised thereby. Most of all, the etch stop layer or region created by diffusion or implantation is by its creation, broad and diffuse, and, when used as described above, results in an SOI layer which is neither thin nor uniform across the entire silicon wafer.

Another method of forming a thin SOI semiconductor layer involving the use of an etch stop layer is disclosed in U.S. Pat. No. 5,013,681 issued to Godbey et al. on May 7, 1991. The method of the '681 patent includes forming a strained silicon germanium (SiGe) etch-stop layer upon a silicon substrate, forming a silicon cap layer upon the strained etch-stop layer, and bonding the silicon cap layer to a mechanical substrate. The silicon substrate and the strained etch stop layer are then removed without removing underlaying portions of the silicon cap layer, whereby the underlaying portions of the silicon cap layer remain on the mechanical substrate to form the thin SOI layer. A disadvantage of using the strained SiGe etch stop layer is that the selectivity of strain sensitive etchants is small and ultra-uniform SOI is thereby not obtainable.

Additionally, the '681 patent teaches a method of using a strained SiGe etch stop layer on top of an ion implanted boron etch stop layer to cap and prevent boron diffusion into the SOI layer, thus enabling higher selectivity etchants, available for boron etch stop layers, to be used. Because of the ion implanted nature of the boron etch stop layer, the etch stop is broad and diffuse, and thus the resulting SOI layer is not exceedingly uniform. Furthermore, the ion implanted layer has dislocations and defects which ultimately get transferred into the SOI layer.

The major inadequacy of the methods of the '681 patent and earlier methods in attaining ultra thin and extremely uniform SOI arises from the fact that commercially available silicon wafers used as the starting substrates are not of exactly uniform thickness across their diameters, typically varying by 10 to 20 microns across a five inch diameter wafer with a nominal thickness of 600 microns. This initial thickness variation is disadvantageously transferred into the silicon cap layer. For example, with an etch rate selectivity ratio of 1:1000 and an initial thickness variation in a bonded silicon wafer pair of 20 microns, the final SOI thickness variation may be theoretically expected to be no better than 20 nm (i.e., 20 $\mu$m/1000=20 nm). For ultra-thin SOI thicknesses of 0.1 $\mu$m or less, this final thickness variation of 20 nm is unacceptable.

While use of such highly selective etchants seems desirable in actual practice, there are drawbacks associated with them. The highly selective etchants are invariably anisotropic and often produce faceted or rough surfaces. Rough surfaces are highly undesirably for CMOS applications. Furthermore, highly selective etchants, such as ethylene diamine and pryocatechol have been judged to be unduly hazardous. Ethylene diamine is reported to cause allergic respiratory sensitization and pyrazine is described as a toxic corrosive. The use of these etchants in a high volume manufacturing process creates undue risk during their use and subsequent disposal thereof.

It is therefore desirable to provide a method of producing an SOI layer using etchants such as potassium hydroxide (KOH) or ammonium hydroxide (NH$_4$OH) which have lower etch selectivities in the range of 500:1 to 100:1 and which do not pose significant health and environmental hazards.

It is further desirable to provide a method for forming an SOI semiconductor layer which is highly uniform and suitable for ultra-thin SOI structures. Such a method should provide for good thickness control for producing an SOI semiconductor layer having a thickness variation of a few nanometers. Such a method should also be suitable for use in large scale manufacturing of SOI wafers using commercially available silicon substrates and environmentally compatible etch chemistries.

SUMMARY OF THE INVENTION

An object of the present invention is to provide an improved silicon-on-insulator (SOI) process.

Another object of the present invention is to provide a silicon-on-insulator process by which the thickness of the SOI semiconductor layer is substantially uniform, having a thickness variation of less than 10 nm.

Yet another object of the present invention is to provide a process that is well suited for large scale manufacturing of SOI wafers.

According to the invention, a method of forming a thin SOI semiconductor layer having ultra-high thickness uniformity, and upon which semiconductor structures can subsequently be formed, comprises the following. A primary substrate having a total thickness variation within a specified range is provided. A thickness variation compression stack is formed upon said primary substrate, the thickness variation compression stack comprising a first strain-free etch stop layer and at least one intermediate layer pair formed upon the first strain-free etch stop layer, each of the at least one intermediate layer pair comprising a spacer layer and a subsequent strain-free etch stop layer formed upon the spacer layer. An epitaxial silicon layer of a desired thickness is formed upon the stack. The epitaxial silicon layer of the primary substrate is then bonded to a mechanical substrate to form a bonded substrate pair, the mechanical substrate having a prescribed total thickness variation within a specified range and the bonded substrate pair having a combined total thickness variation equal to the sum of the total thickness variations of the primary and mechanical substrates, respectively. The primary substrate is then removed, wherein the combined total thickness variation of the bonded substrate pair is transferred by a first compression amount into the stack. The stack is then removed, wherein the combined thickness variation of the bonded substrate pair is further transferred and compressed a second compression amount into the epitaxial silicon layer, whereby the epitaxial silicon layer remains on the mechanical substrate to form the SOI semiconductor layer of ultra-high thickness uniformity, the thickness uniformity being a function of the first and second compression amounts.

BRIEF DESCRIPTION OF THE DRAWINGS

The foregoing and other structures and teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

As explained in the background section, the thickness uniformity and integrity of a thin SOI layer is effected by the method of making the same. In addition, the method of producing a thin SOI layer should be highly suitable for high volume manufacturing. Because bond and etch back techniques are known in the art, the present description will be directed in particular to elements and processes forming part of, or cooperating directly with, the novel method according to the present invention. Elements and processes not specifically shown or described herein may be selected from those known in the art.

Figure 1:
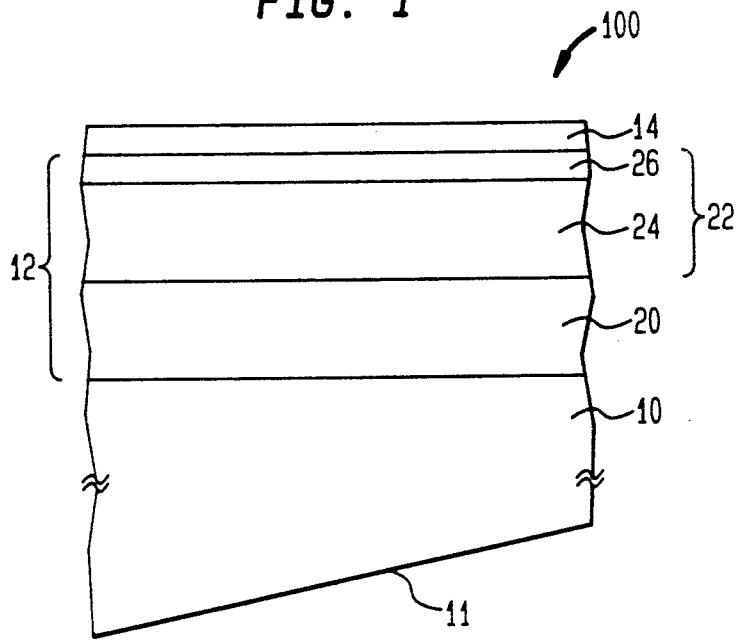
FIG. 1 is a cross-sectional view of a primary wafer used in accordance with the method of the present invention, the primary wafer comprising a primary silicon substrate having a thickness variation compression stack and an epitaxial layer thereon.

Referring now to FIG. 1, the method of the present invention begins with the processing of a primary wafer 100 comprising a first semiconductor substrate or primary silicon substrate 10. Primary substrate 10 can comprise, for example, a P$^-$ or an N$^-$, 5 inch diameter silicon substrate, such as commercially available from Shin-Etsu Handotai (S.E.H.) of Tokyo, Japan. Such a commercially available substrate is of a desired thickness, for example 500–600 $\mu$m, with a typical or nominal thickness uniformity tolerance of 10 to 20 $\mu$m. In other words, the total thickness variation (TTV) of primary substrate 10 can be as much as 20 $\mu$m, as shown representatively in FIG. 1 by the non-horizontal surface 11 of primary substrate 10. Substantial reduction of this TTV in the primary substrate 10 cannot be accomplished by commercially available techniques of grinding and polishing, since grinding typically introduces the thickness non-uniformity of 10 to 20 μm.

Figure 2:
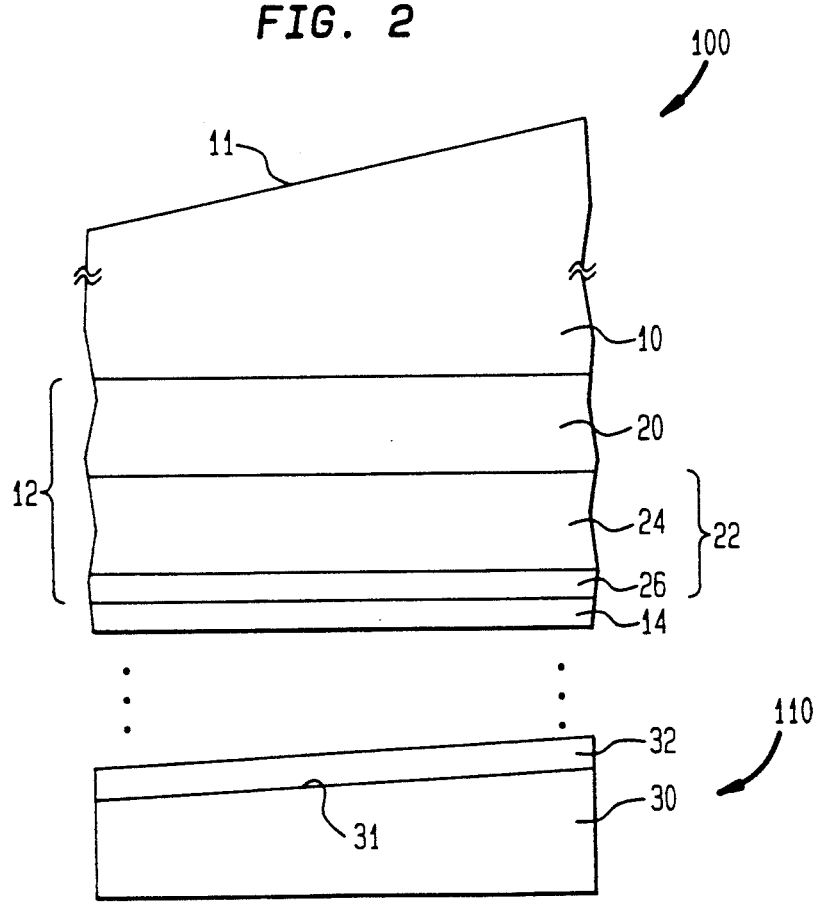
FIG. 2 is a cross-sectional view of the primary wafer of FIG. 1 positioned above a mechanical support substrate or handle wafer prior to being bonded to the same.

As will be further understood herein below, a mechanical substrate 30 is provided, as shown in FIG. 2, for subsequent wafer bonding with the primary substrate 10. Mechanical substrate 30 preferably comprises an original silicon substrate 30, similar to primary substrate 10, for example, a P− or an N−, 5 inch diameter silicon substrate, such as commercially available from S.E.H. of Tokyo, Japan. Substrate 30 is of a desired thickness on the order of 500–650 μm with a typical or nominal thickness uniformity tolerance of 10 to 20 μm. In other words, the total thickness variation (TTV) of handle substrate 30 can be as much as 20 μm, as shown representatively in FIG. 2 by the non-horizontal surface 31 of substrate 30. Substrate 30 may likewise comprise an original germanium substrate or any other suitable substrate.

The TTV of primary substrate 10 and the TTV of mechanical substrate 30 must be compensated for, particularly, in the manufacture of an ultra-thin SOI silicon layer, and at the same time, keep defects to a minimum. Uniform thickness and minimal defects in the SOI silicon layer are not only highly desirable, but necessary for optimal device performance of the sub-half micron devices manufactured therewith.

In accordance with the present invention, a thickness variation compression stack 12 is formed upon the primary substrate 10 for compressing thickness variation introduced into semiconductor layer 14, the thickness variation being attributable to a combined total thickness variation of primary substrate 10 and mechanical substrate 30. Thickness variation compression stack 12 comprises a first strain-free etch stop layer 20 formed upon a top surface of primary substrate 10. At least one intermediate layer pair 22, comprising a spacer layer 24 and a strain-free etch stop layer 26, is formed upon the first strain-free etch stop layer 20. While only one intermediate layer pair 22 is shown, it will be understood that more than one intermediate layer pair 22 may be included in the thickness variation compression stack 12, as desired, for achieving a particular thickness uniformity.

In further detail of the formation of thickness variation compression stack 12, a first strain-free etch stop layer 20 is formed upon a top surface of primary substrate 10. Strain-free etch stop layer 20 comprises an abrupt, well-defined, etch stop layer which is epitaxially grown by low temperature techniques known in the art, such as, gas source molecular beam epitaxy (MBE), ultra high vacuum chemical vapor deposition (UHVCVD), or low temperature atmospheric pressure (AP) CVD. For example, layer 20 is grown at temperatures between 500° C. to 650° C. Layer 20 is further highly doped with boron but is made strain-free by co-doping with germanium. Additionally, layer 20 is of highly uniform thickness.

Strain-free etch stop layer 20 contains minimal defects. Preferably, first strain-free etch stop layer 20 comprises a boron/germanium strain compensated etch stop layer. Boron dopant in epitaxial silicon compresses the epitaxial silicon while germanium dopant in epitaxial silicon expands the same. To achieve a strain-free or strain compensated etch stop layer, the boron/germanium dopant concentration of strain-free etch stop layer 20 preferably comprises boron in the range of $1 \times 10^{20}$ atoms/cm$^3$ to $5 \times 10^{20}$ atoms/cm$^3$ compensated by 0.5% to 2.5% germanium, respectively.

Such a strain-free etch stop layer 20 is to be contrasted and distinguished from a "strained" silicon/germanium etch stop layer. A disadvantage of "strained" etch stop layers is that they cannot be used as a superlattice or in a sequence of multiple etch stop layers, since the "strained" etch stop layers, when stacked and if the total thickness exceeds a certain critical thickness, break down and result in defects and dislocations. For $Si_{0.7}Ge_{0.3}$, the critical thickness is only about 60 nm. "Strain-free" etch stop layers, on the other hand, can be used in a sequence of multiple etch stop layers without any limit to their thickness or number.

As will be further understood from the discussion to follow herein below, the thickness of strain-free etch stop layer 20 is chosen to be at least thick enough to compensate for the effect of the combined total thickness variation of the primary substrate 10 and mechanical substrate 30 bonded pair, and further in light of the selectivity of the etchant chosen for use in the subsequent removal of the primary substrate 10. In other words, the subsequent removal of the primary substrate 10 will cause the combined total thickness variation of the primary substrate 10 and mechanical substrate 30 bonded pair to be transferred into the strain-free etch stop layer 20 by a certain amount, resulting in an introduced thickness variation into layer 20. Thus, according to the present invention, the thickness of strain-free etch stop layer 20 is, at a minimum, equal to the combined total thickness variation of the primary substrate 10 and mechanical substrate 30 bonded pair divided by the selectivity of the etchant used for subsequent etching of primary substrate 10. In practice, the thickness of strain-free etch stop layer 20 is greater than or equal to the above minimum thickness, and more preferably, greater than the minimum thickness by a factor of 3 to 5 to allow for variations of etch conditions and for smoothing of surfaces, to be discussed further herein below.

Upon a top surface of strain-free etch stop layer 20 is formed at least one intermediate layer pair 22 as indicated above, each intermediate layer pair 22 comprising a spacer layer 24 and a strain-free etch stop layer 26. Spacer layer 24 preferably comprises an intrinsic silicon layer and is formed by any suitable method known in the art. The thickness of spacer layer 24 is selected to be at least thick enough to compensate for the effects of the introduced thickness variation of the strain-free etch stop layer 20 and further in light of the subsequent removal of strain-free etch stop layer 20. The thickness of spacer layer 24, at a minimum, is equal to the introduced thickness variation of strain-free etch stop layer 20 divided by the selectivity of the etchant used for subsequent removal of strain-free etch stop layer 20. In other words, the subsequent removal of the layer 20 will cause the introduced thickness variation of layer 20 to be transferred into the spacer layer 24 by a certain amount, resulting in an introduced thickness variation into layer 24. In practice, the thickness of spacer layer 24 is selected to be 1 to 5 times the thickness of the first strain-free etch stop layer 20 to compensate for any effects of a dopant tail, typically on the order of 25 nm, extending into spacer layer 24 resulting from etch stop layer 20, to be discussed further herein below.

The thickness of strain-free etch stop layer 26 is similarly chosen, in that, it is to be at least thick enough to compensate for the effects of the introduced thickness variation of spacer layer 24 and further in light of the selectivity of the etchant chosen for use in the subsequent removal of the spacer layer 24. The thickness of strain-free etch stop layer 26, at a minimum, is equal to the total thickness variation of spacer layer 24 divided by the selectivity of the etchant used for subsequent removal of spacer layer 24. In practice, the thickness of strain-free etch stop layer 26 is greater than or equal to the above minimum thickness, and more preferably, greater than the minimum thickness by a factor of 3 to 5 to allow for variations of etch conditions and for smoothing of surfaces as a result of etchant roughening, to be discussed further herein below. Should the minimum thickness be chosen, however, a critical etch would be necessary in the subsequent removal of the etch stop layer 26.

Upon a top surface of the at least one intermediate layer pair 22 of thickness variation compression stack 12 is formed silicon layer 14 of a desired SOI thickness. Silicon layer 14 is epitaxially grown by similar low temperature epitaxial techniques as used to grow the strain-free etch stop layers.

Figure 3:
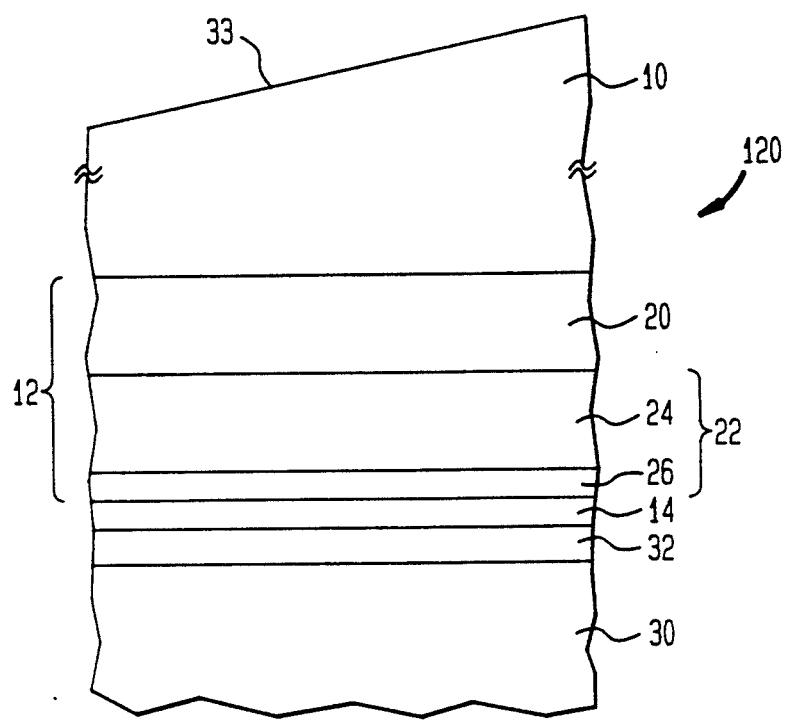
FIG. 3 is a cross-sectional view of the primary wafer of FIG. 1 bonded to the mechanical support.

Primary wafer 100 is then flipped over and wafer bonded to a secondary or handle wafer 110 as shown in FIGS. 2 and 3. Wafer bonding is well known in the art and only briefly discussed herein. Handle wafer 110 preferably comprises substrate 30, as previously discussed, and further having an oxide layer 32 formed on a top surface of substrate 30. Primary wafer 100 is placed in contact with handle wafer 110 such that silicon layer 14 is in intimate contact with oxide layer 32. Wafers 100 and 110 are then subjected to a heat treatment for a predetermined period of time until the oxide layer 32 and the silicon layer 14 bond together, as shown in FIG. 3 to form bonded wafer pair 120. This heat treatment should be at temperatures low enough to prevent significant thermal diffusion of boron from the strain-free etch stop layers. The temperatures are no more than 800° C., and more preferably below 700° C. The resultant TTV of the bonded wafer pair 120, comprising primary wafer 100 and handle wafer 110, is the sum of the individual TTVs of primary substrate 10 and handle substrate 30, as shown representatively in FIG. 3 by the non-horizontal surface 33.

Figure 4:
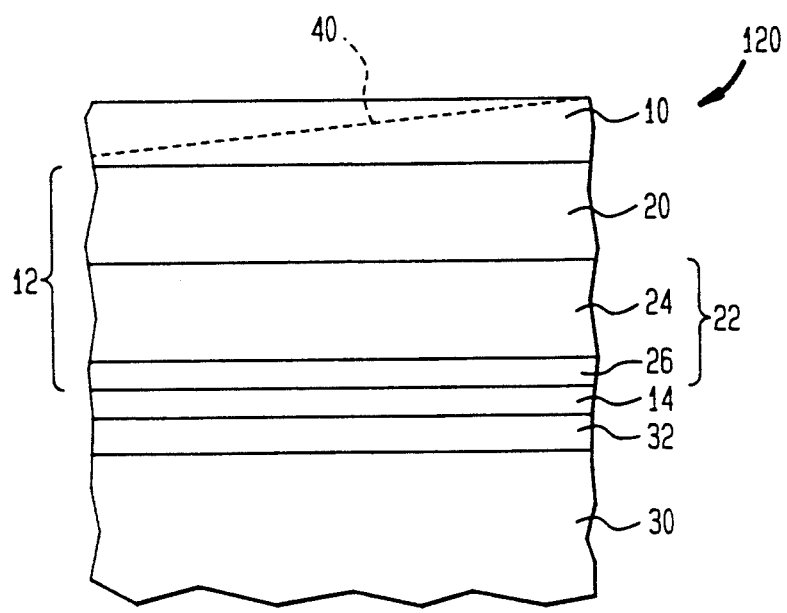
FIG. 4 is a cross-sectional view of the mechanical support substrate with the primary silicon substrate substantially removed.

Subsequent to bonding the primary wafer 100 to handle wafer 110, the primary substrate 10 is removed. Removal of primary substrate 10 is accomplished in preferably two steps, that is, grinding approximately 80 to 90 percent of the primary substrate 10 and thereafter selectively etching a remaining portion of the primary substrate 10. Removal of a substantial portion of primary substrate 10 can be accomplished by subjecting the structure as shown in FIG. 3 to a conventional sequence of grinding, lapping, wet etching, and/or chemical mechanical polishing to substantially reduce the thickness of primary substrate 10 preferably by 80-90% of the original thickness. The remainder portion of substrate 10, as shown in FIG. 4, preferably comprises a thickness of at least equal to approximately twice the total thickness variation of the bonded wafer pair 120 of primary substrate 10 and handle substrate 30. In this manner, grinding into the first strain-free etch stop layer 20 is advantageously avoided. For example, if primary substrate 10 comprises a substrate having an original thickness of 600 μm with a total thickness variation of ±20 μm and handle substrate 30 has a total thickness variation of ±20 μm, then it is desirable to grind at most 560 μm. In this manner, a remainder portion of substrate 10 comprises at least 40 μm±40 μm, thereby avoiding grinding into the underlying layer. Total thickness variation in the remainder portion of primary substrate 10 thus comprises the TTV of the bonded wafer pair 120, as represented by the dashed line identified by the numeral 40 in FIG. 4.

As indicated above, the remainder portion of primary substrate 10 is selectively etched to remove the same. The etch preferably comprises an etchant having an etch selectivity of 500:1 or below (e.g., 500:1, 200:1, 100:1, 50:1). Additionally, the etch is chosen, in part, according to the design of the compression stack 12 (i.e., the number of intermediate layer pairs and the selectivity of etchants to be used in the removal of the layers of stack 12) and the desired resultant total thickness variation in the SOI silicon layer. According to the above example, for a TTV of the bonded wafer pair of 40 μm and an etch selectivity of 100:1, the amount by which the TTV of the bonded wafer pair will be transferred and compressed into stack 12, and more particularly, strain-free etch stop layer 20, is an amount equal to approximately 400 nm (i.e., 40 μm/100). In this example, the thickness of strain-free etch stop layer 20 must have been selected to be greater than or equal to the above noted transferred and compressed amount of 400 nm. In regards to the earlier discussion of the formation of etch stop layer 20, it is preferable to select the thickness of etch stop layer 20 to be 3 to 5 times this amount of 400 nm to allow for variations of etch conditions and for smoothing of the etched surface. Thus, etch stop layer 20 is 1200 to 2000 nm thick. The transferred and compressed thickness variation amount into stack 20 and, more particularly, strain-free etch stop layer 20 is shown representatively in FIG. 5 by the dashed lined indicated by numeral 42.

Figure 8:
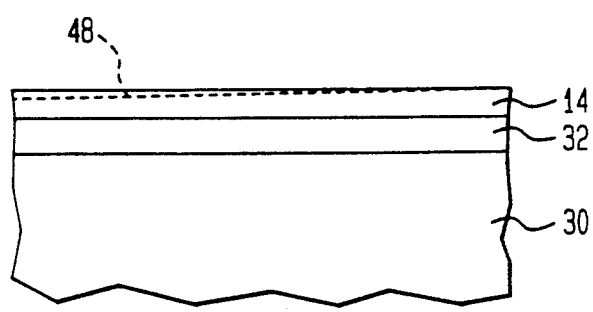
FIG. 8 is a cross-sectional view of the mechanical support substrate with the overlaying portions of the epitaxial layer removed.

The thickness variation compression stack 12 is thereafter removed, wherein the total thickness variation 40 of the bonded wafer pair 120 is transferred and compressed a compression amount into the epitaxial silicon layer 14. The compression amount representative of the thickness variation in the silicon layer 14 is shown in FIG. 8 as indicated by the dashed line numbered 48.

Figure 5:
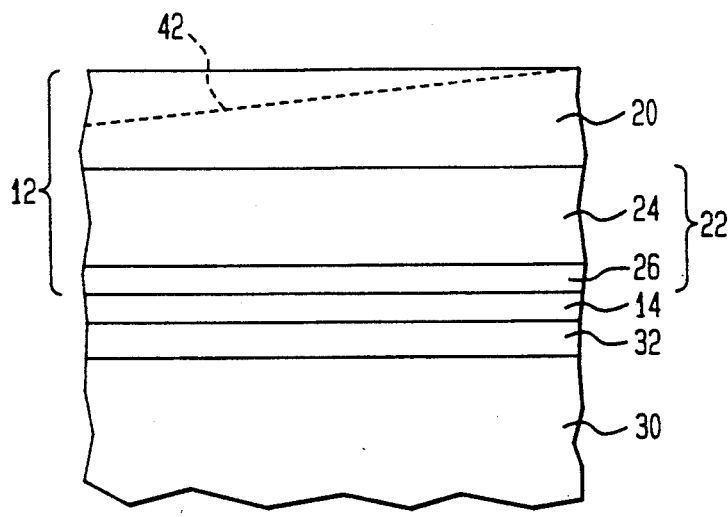
FIG. 5 is a cross-sectional view of the mechanical support substrate with the primary silicon substrate completely removed.

Referring now to FIG. 5, removal of stack 12 begins with the removal of first strain-free etch stop layer 20. Preferably, strain-free etch stop layer 20 is removed by a low-selectivity etch having a selectivity of 10:1 or below, further characterized by leaving the etched surface smooth, wherein the thickness variation 40 of the bonded wafer pair 120 is further transferred and compressed an amount into the at least one intermediate layer pair 22, and more particularly, an uppermost spacer layer 24. According to the above example, for a TTV of 400 nm in the layer 20 and an etch selectivity of 10:1, the amount by which the TTV will be transferred and compressed into layer 24 is an amount equal to approximately 40 nm (i.e., 400 nm/10). This transferred and compressed thickness variation amount is shown representatively in FIG. 6 by the dashed line indicated by numeral 44.

Figure 6:
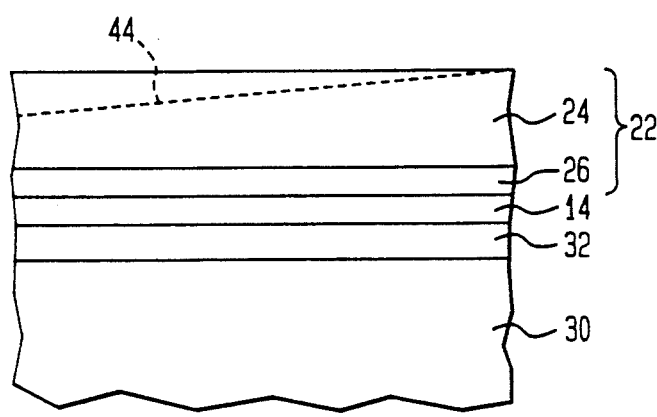
FIG. 6 is a cross-sectional view of the mechanical support substrate with an uppermost strain-free etch stop layer removed.
Figure 7:
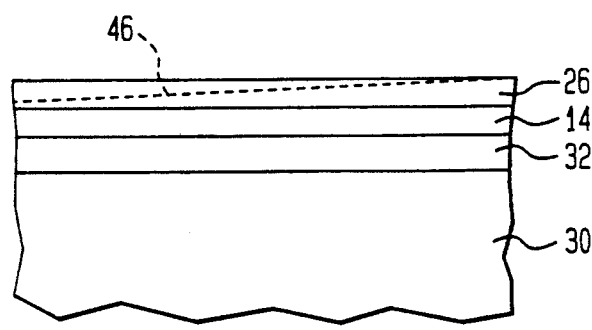
FIG. 7 is a cross-sectional view of the mechanical support substrate with an uppermost spacer layer removed.

Referring to FIG. 6, removal of the at least one intermediate layer pair 22 comprises for each layer pair, the removal of spacer layer 24 followed by the removal of underlying strain-free etch stop layer 26. Removal of spacer layer 24 preferably comprises selectively etching spacer layer 24 to remove the same with an etchant having an etch selectively of 500:1 or below. Removal of spacer layer 24 causes the thickness variation 40 of the bonded wafer pair 120 to be further transferred and compressed an amount into the underlying strain-free etch stop layer 26. Following the above example, for a TTV of 40 nm in the spacer layer 24 and an etch selectivity of 100:1, the amount by which the TTV will be transferred an into layer 26 is an amount equal to approximately 0.4 nm (i.e., 40 nm/100). This transferred and compressed thickness variation amount is shown representatively in FIG. 7 by the dashed line indicated by numeral 46.

Strain-free etch stop layer 26 of the at least one intermediate layer pair 12 is then removed by a low-selectivity etch having a selectivity of 10:1 or below, wherein the TTV 40 of the bonded wafer pair 120 is yet still further transferred and compressed an amount into the SOI epitaxial silicon layer 14. In following the example presented above, for a TTV of 0.4 nm in layer 26 and an etch selectivity of 10:1, the amount by which the TTV will be transferred and compressed into silicon layer 14 is an amount equal to approximately 0.04 nm (i.e., 0.4 nm/10). This transferred and compressed thickness variation amount is shown representatively in FIG. 8 by the dashed line indicated by numeral 48. The resultant silicon layer 14 produced thereby forms the SOI layer of ultra-high thickness uniformity.

In an alternate embodiment, the method comprises similar steps as in the preferred embodiment with the following difference in that the strain-free etch stop layers 20 and 26 are removed non-selectively. Non-selective removal of the strain-free etch stop layers 20 and 26 can be by high pressure oxidation and stripping techniques, known in the art. For example, strain-free etch stop layers 20 and 26 may be exposed to suitable oxygen and pressure conditions to oxidize the same and then be dipped in a stripping hydrofluoric (HF) acid solution for removal of the oxidized layers.

There is thus provided a novel method for forming an SOI layer having ultra-high thickness uniformity, crystal perfection, and integrity. The present method utilizes selective etchants suitable for the use in high volume manufacturing. In addition, a desired thickness uniformity can be obtained by an appropriate formulation of the thickness variation compensation stack (i.e., selection of strain-free etch stop layer and spacer layer thicknesses and the number of intermediate layer pairs) and the etchants selected for removal of the same.

While the invention has been particularly shown and described with reference to the preferred embodiment thereof, it will be understood by those skilled in the art that various changes in form and detail may be made therein without departing from the spirit and scope of the invention. For instance, bonding of the primary wafer to the handle wafer may include forming a thin oxide layer upon a top surface of SOI silicon layer 14. The oxide layer can comprise a pyrolytically deposited, CVD oxide, or sputtered oxide, upon silicon layer 14, thus eliminating silicon consumption.

What is claimed is:

1. A method of forming a semiconductor layer having ultra-high thickness uniformity and upon which semiconductor structures can subsequently be formed, comprising the steps of:
   a) providing a primary substrate having a prescribed total thickness variation;
   b) forming a stack upon said primary substrate for compressing thickness variation to be transferred into the semiconductor layer, said thickness variation compression stack comprising a first strain-free etch stop layer and at least one intermediate layer pair formed upon said first strain-free etch stop layer, said at least one intermediate layer pair each comprising a spacer layer and a subsequent strain-free etch stop layer formed upon said spacer layer;
   c) forming an epitaxial silicon layer of a desired thickness upon said stack;
   d) bonding said epitaxial silicon layer to a mechanical substrate to form a bonded substrate pair, said mechanical substrate having a prescribed total thickness variation and said bonded substrate pair having a combined total thickness variation equal to the sum of the respective total thickness variations of said primary and said mechanical substrates;
   e) removing said primary substrate, wherein the combined thickness variation of said bonded substrate pair is transferred and compressed into said stack a first compression amount; and
   f) removing said stack, wherein the combined thickness variation of said bonded substrate pair is further transferred and compressed a second compression amount into said epitaxial silicon layer, whereby said epitaxial silicon layer remains on said mechanical substrate to form the semiconductor layer of ultra-high thickness uniformity, the thickness uniformity being a controlled function of said first and second compression amounts.

2. The method of claim 1, wherein
said first strain-free etch stop layer comprises a boron/germanium strain compensated etch stop layer,
said spacer layer of each said at least one intermediate layer pair comprises an intrinsic silicon layer, and
said strain-free etch stop layer of each said at least one intermediate layer pair comprises a boron/germanium strain compensated etch stop layer.

3. The method of claim 1, wherein
said first strain-free etch stop layer comprises a boron/germanium strain compensated etch stop layer having a dopant concentration of boron in the range of $1 \times 10^{20}$ atoms/cm$^3$ to $5 \times 10^{20}$ atoms/cm$^3$ compensated by 0.5% to 2.5% germanium, respectively, and
said stain-free etch stop layer of each said at least one intermediate layer pair comprises a boron/germanium strain compensated etch stop layer having a dopant concentration of boron in the range of $1 \times 10^{20}$ atoms/cm$^3$ to $5 \times 10^{20}$ atoms/cm$^3$ compensated by 0.5% to 2.5% germanium, respectively.

4. The method of claim 1, wherein
step e) comprises grinding approximately 80 to 90 percent of said primary substrate to provide a remainder portion thereof and thereafter selectively etching the remainder portion of said primary substrate with an etch having a selectivity of 500:1 or below.

5. The method of claim 1, wherein
step f) comprises f$_1$) removing said first strain-free etch stop layer with a low-selectivity etch having a selectivity of 10:1 or below, followed by f$_2$) removing said at least one intermediate layer pair, the removal of said at least one intermediate layer pair comprising, for each intermediate layer pair, the steps of f$_2$a) removing said spacer layer and f$_2$b) etching said strain-free etch stop layer with a low-selectivity etch having a selectivity of 10:1 or below.

6. The method of claim 5, further wherein the step f$_2$a) of removing said spacer layer of each said at least one intermediate layer pair comprises selectively etching said spacer layer with an etch having a selectivity of 500:1 or below.

7. The method of claim 1, wherein
step f) comprises $f_1$) removing said first strain-free etch stop layer with a non-selective etch followed by $f_2$) removing said at least one intermediate layer pair, the removal of said at least one intermediate layer pair comprising, for each intermediate layer pair, the steps of $f_2a$) removing said spacer layer and $f_2b$) etching said strain-free etch stop layer with a non-selective etch.

8. The method of claim 7, further wherein the step $f_2a$) of removing said spacer layer of each said at least one intermediate layer pair comprises selectively etching said spacer layer with an etch having a selectivity of 500:1 or below.

9. The method of claim 7, further wherein the steps of $f_1$) and $f_2b$) comprise non-selectively etching by high pressure oxidation and stripping.

10. The method of claim 1, wherein said at least one intermediate layer pair of step b) comprises one pair.

11. A method of forming a Silicon-On-Insulator (SOI) semiconductor layer having ultra-high thickness uniformity and upon which semiconductor structures can subsequently be formed, comprising the steps of:
a) providing a primary substrate having a prescribed total thickness variation;
b) forming a stack upon said primary substrate for compressing thickness variation to be transferred into the SOI semiconductor layer, said thickness variation compression stack comprising a first strain-free etch stop layer having a dopant concentration of boron in the range of $1 \times 10^{20}$ atoms/cm$^3$ to $5 \times 10^{20}$ atoms/cm$^3$ compensated by 0.5% to 2.5% germanium, respectively, and at least one intermediate layer pair formed upon said first strain-free etch stop layer, said at least one intermediate layer pair each comprising a spacer layer and a subsequent strain-free etch stop layer having a dopant concentration of boron in the range of $1 \times 10^{20}$ atoms/cm$^3$ to $5 \times 10^{20}$ atoms/cm$^3$ compensated by 0.5% to 2.5% germanium, respectively, formed upon said spacer layer;
c) forming an epitaxial silicon layer of a desired SOI thickness upon said stack;
d) bonding said epitaxial silicon layer to a mechanical substrate to form a bonded substrate pair, said mechanical substrate having a prescribed total thickness variation and said bonded substrate pair having a combined total thickness variation equal to the sum of the respective total thickness variations of said primary and said mechanical substrates;
e) removing said primary substrate, wherein the combined thickness variation of said bonded substrate pair is transferred and compressed into said stack a first compression amount; and f) removing said stack, wherein the combined thickness variation of said bonded substrate pair is further transferred and compressed a second compression amount into said epitaxial silicon layer,
whereby said epitaxial silicon layer remains on said mechanical substrate to form the SOI semiconductor layer of ultra-high thickness uniformity, the thickness uniformity being a controlled function of said first and second compression amounts.

12. The method of claim 11, wherein
step e) comprises grinding approximately 80 to 90 percent of said primary substrate to provide a remainder portion thereof and thereafter selectively etching the remainder portion of said primary substrate with an etch having a selectivity of 500:1 or below; and
step f) comprises $f_1$) removing said first strain-free etch stop layer with a low-selectivity etch having a selectivity of 10:1 or below, followed by $f_2$) removing said at least one intermediate layer pair, the removal of said at least one intermediate layer pair comprising, for each intermediate layer pair, the steps of $f_2a$) removing said spacer layer and $f_2b$) etching said strain-free etch stop layer with a low-selectivity etch having a selectivity of 10:1 or below.

13. The method of claim 12, further wherein the step $f_2a$) of removing said spacer layer of each said at least one intermediate layer pair comprises selectively etching said spacer layer with an etch having a selectivity of 500:1 or below.

14. The method of claim 11, wherein
step e) comprises grinding approximately 80 to 90 percent of said primary substrate to provide a remainder portion thereof and thereafter selectively etching the remainder portion of said primary substrate with an etch having a selectivity of 500:1 or below; and
step f) comprises $f_1$) removing said first strain-free etch stop layer with a non-selective etch followed by $f_2$) removing said at least one intermediate layer pair, the removal of said at least one intermediate layer pair comprising, for each intermediate layer pair, the steps of $f_2a$) removing said spacer layer and $f_2b$) etching said strain-free etch stop layer with a non-selective etch.

15. The method of claim 14, further wherein the step $f_2a$) of removing said spacer layer of each said at least one intermediate layer pair comprises selectively etching said spacer layer with an etch having a selectivity of 500:1 or below.

16. The method of claim 14, further wherein the steps of $f_1$) and $f_2b$) comprise non-selectively etching by high pressure oxidation and stripping.

17. The method of claim 11, wherein said at least one intermediate layer pair of step b) comprises one pair.

* * * * *